United States Patent [19]

Dziagwa

[11] Patent Number: 4,743,860

[45] Date of Patent: May 10, 1988

[54] AUDIO POWER AMPLIFIER

[75] Inventor: James M. Dziagwa, Addison, Ill.

[73] Assignee: Seeburg Phonograph Corporation, Addison, Ill.

[21] Appl. No.: 24,253

[22] Filed: Mar. 10, 1987

[51] Int. Cl.⁴ .............................................. H03F 3/217
[52] U.S. Cl. ..................................... 330/251; 330/264
[58] Field of Search ....................... 307/239, 240, 241; 330/10, 207 A, 251, 264, 265, 269

[56] References Cited

U.S. PATENT DOCUMENTS 4,464,634  8/1984  Velazquez ........................... 330/264
4,483,016 11/1984  Hochstein et al. ............. 330/264 X
4,531,096  7/1985  Yokoyama ............................ 330/10

Primary Examiner—Eugene R. Laroche
Assistant Examiner—Steven J. Mottola
Attorney, Agent, or Firm—Wood, Dalton, Phillips, Mason & Rowe

[57] ABSTRACT

A power amplifier circuit described herein is utilized as an audio output driver circuit for a currency-operated phonograph player. First and second series capacitors have a junction therebetween and are coupled across a floating, double-ended power supply. A speaker is coupled between the junction and ground. First and second complementary conductivity power MOSFETs are connected between a first power supply output and ground and between a second power supply output and ground, respectively. The MOSFETs are driven by an amplified audio input signal and alternately connect one or the other power supply outputs to ground to alternately charge and discharge the capacitors causing alternating current to flow through the speaker.

15 Claims, 4 Drawing Sheets

AUDIO POWER AMPLIFIER

FIELD OF THE INVENTION

This invention relates generally to amplifier circuits, and more particularly to an audio power amplifier circuit.

BACKGROUND OF THE INVENTION

Audio reproduction equipment for driving one or more speakers include a power amplifier circuit or stage for amplifying an audio signal in order to drive the speakers. Typically, such a power amplifier utilizes power transistors as amplification devices. In fact, power MOSFETS have been shown to provide improved performance as compared to other types of transisters.

An example of an audio power amplifier circuit utilizing power MOSFETS is disclosed in Hochstein et al, U.S. Pat. No. 4,483,016. The circuit includes P-type MOSFET's which are controlled by an audio signal to alternately couple a positive voltage power supply and a negative voltage power supply to a speaker. This circuit requires the use of two power supplies, one of which supplies the positive voltage and the other of which supplies the negative voltage. The use of two power supplies increases the size and cost of the overall circuit.

Velazquez, U.S. Pat. No. 4,464,634 discloses a an audio power amplifier circuit similar to that in Hochstein et al, replacing the two power supplies with a single power source. However, two high voltage rectifier circuits are required to provide a positive voltage and a negative voltage. Such a construction results in the duplication of the rectifier components increasing the size and cost of the unit.

The present invention is intended to overcome these and other problems associated with audio power amplifier circuits.

SUMMARY OF THE INVENTION

In accordance with the present invention, an audio power amplifier circuit utilizes fewer components than other amplifier circuits, thus reducing size and cost and increasing reliability.

Broadly, the power amplifier circuit includes a source of reference potential and a double-ended floating power supply having first and second power supply outputs. First and second controllable power switches are connected between the first power supply output and the source of reference potential and between the second power supply output and the source of reference potential, respectively. First and second series-connected capacitors having a junction therebetween are coupled between the power supply outputs. A load in the form of a speaker is coupled between the junction and the source of reference potential. The switches are operated in response to an audio input signal to alternately couple the first and second power supply outputs to the source of reference potential. The capacitors are thus alternately charged and discharged to induce load currents, comprising an amplified version of the audio input signal, in the speaker.

In the preferred embodiment of the invention, the power amplifier circuit is provided with a DC feedback circuit which sums the power supply outputs with the audio input signal so that the power supply outputs are of equal but opposite polarity with respect to ground when the power amplifier is in a quiescent state.

DESCRIPTION OF THE PREFERRED EMBODIMENT

Figure 1:
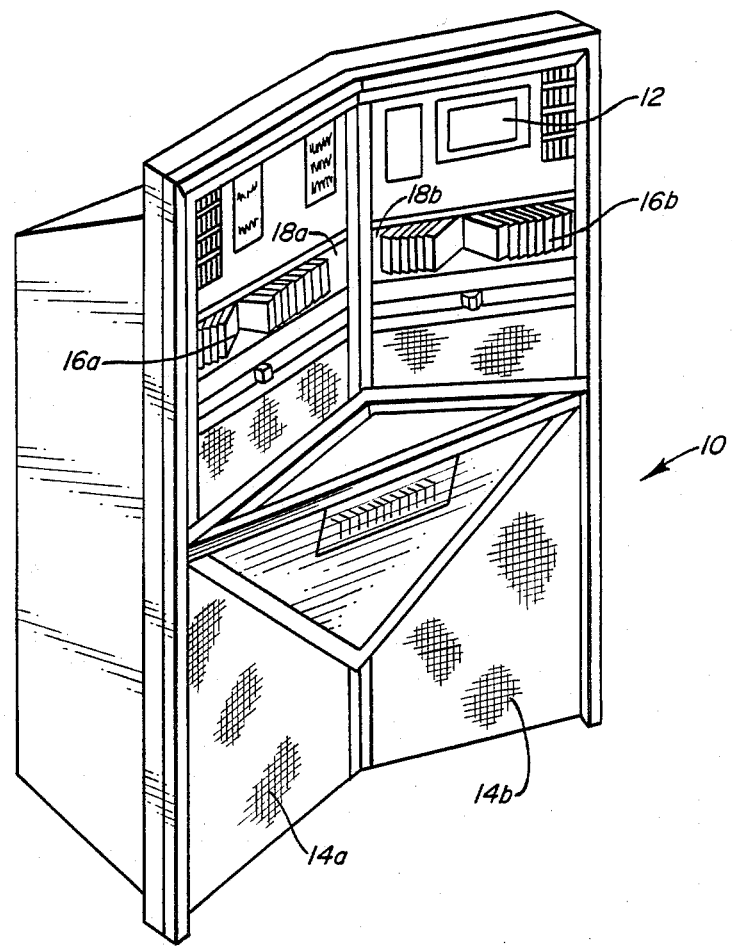
FIG. 1 is a perspective view of a currency-operated phonograph including the audio power amplifier circuit of the present invention.

Referring to FIG. 1, a currency-operated phonograph 10, including the power amplifier circuit of the present invention, includes a control panel 12, left and right speakers 14a, 14b and a pair of display units 16a, 16b. Each of the display units 16a, 16b includes a compartment which partially is enclosed with a transparent front face window 18a, 18b, respectively. A series of cards or other promotional or informational material is stored behind the front face 18 of each display unit 16a, 16b.

Figure 2:
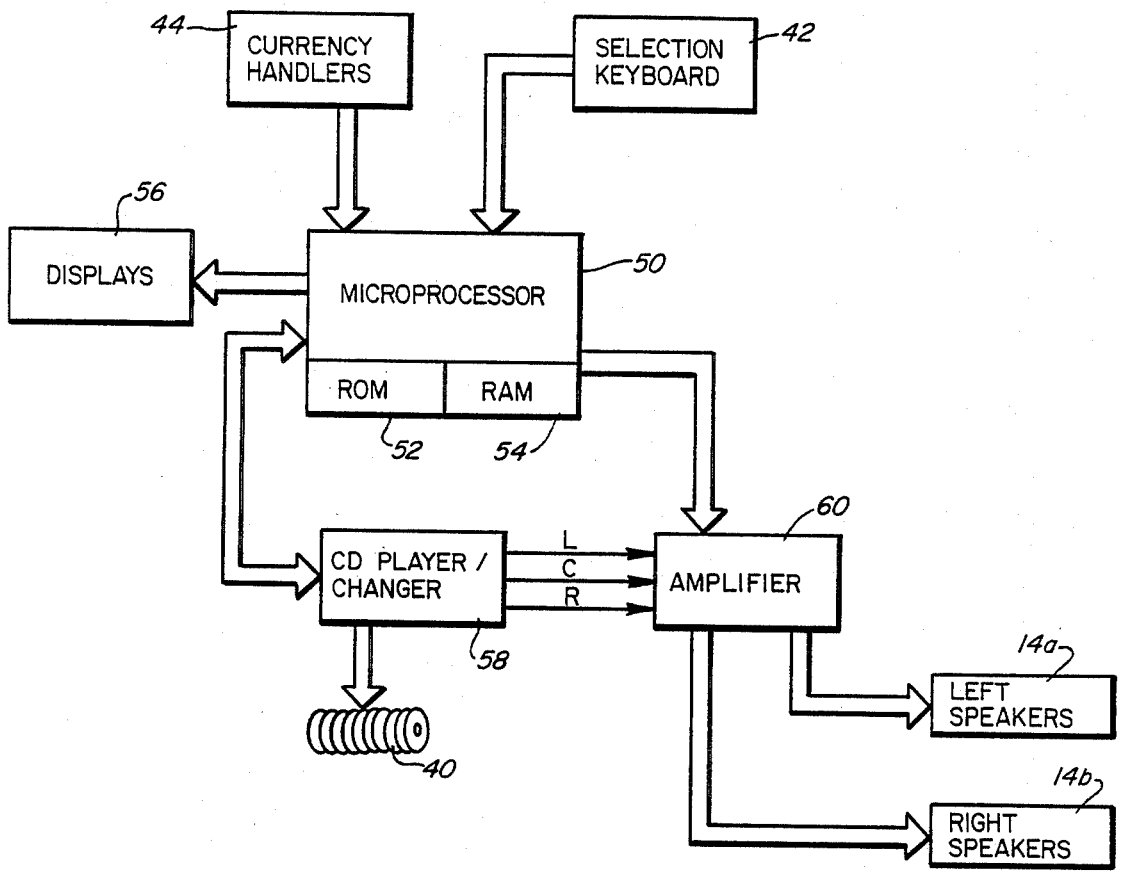
FIG. 2 is a block diagram of the phonograph circuitry.

In the preferred embodiment, the photograph 10 comprises a currency-operated compact disc (CD) player which is capable of playing selections from any one of a plurality of compact discs 40, see FIG. 2. It should be noted that the phonograph 10 may be of a different type which is adapted to play selections from different types of storage devices, such as LPs, 45's, video discs, or any other type of memory device.

Referring also to FIG. 2, the control panel 12 includes a selection keyboard 42 and a currency-handling apparatus 44. In the preferred embodiment, the currencyhandler 44 is capable of accepting dollar bills and allowing a patron to select a predetermined number of selections for each dollar bill deposited. The selection keyboard 42 and currency-handling apparatus 44 are coupled to a microprocessor 50 which executes a control program to control the servicing of user requests. The control program is described in greater detail in Dziagwa et al copending application U.S. Ser. No. 022,070, assigned to the assignee of the present invention, the disclosure of which is hereby incorporated by reference. The microprocessor 50 is in turn coupled to an internal or external memory comprising a read only memory (ROM) 52 containing the control program and a random access memory (RAM) 54 for storing intermediate selection data. The microprocessor 50 also operates a series of indicating displays 56 which are mounted in a front portion of the photograph 10.

The microprocessor 50 is coupled to and operates a CD player/changer 58 which includes disc-handling apparatus to select and play a desired track fromone of the CDs 40. The player/changer 58 develops audio signals which are coupled to an amplifier 60 which is also responsive to the microprocessor 50. The amplifier 60 develops audio signals of an appropriate level to drive the left and the right speakers 14a, 14b.

Figure 3:
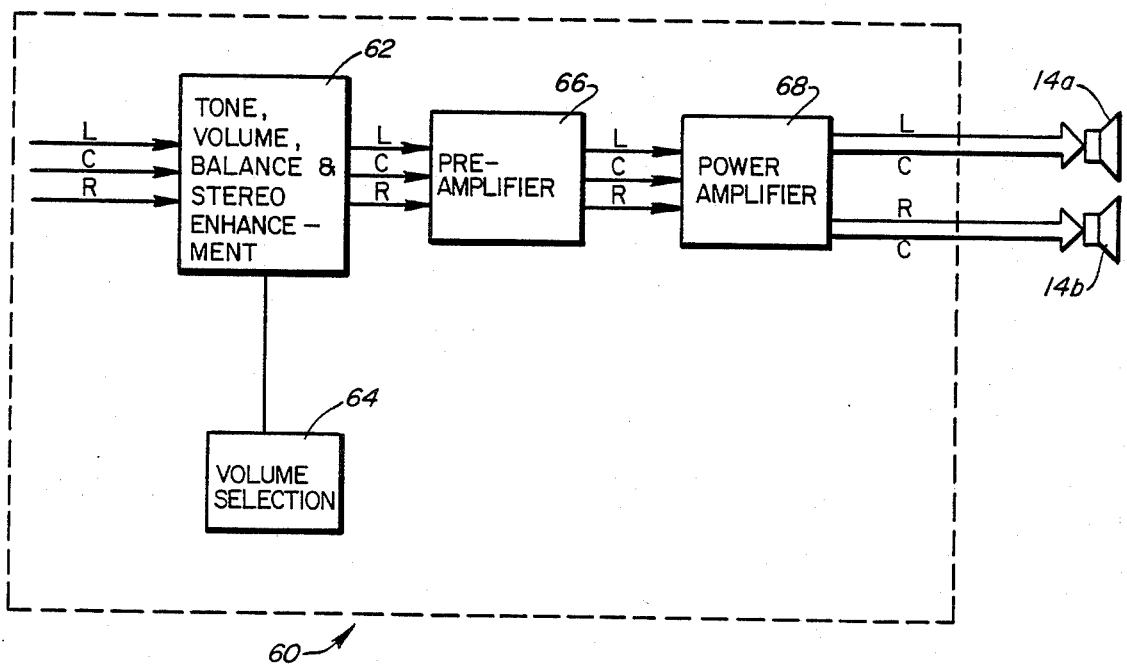
FIG. 3 is a block diagram of the amplifier shown in FIG. 2 including two audio power amplifier circuits according to the present invention.

Referring now to FIG. 3, there is illustrated a block diagram of the amplifier 60. The audio signals developed by the player/changer 58 are coupled to a tone, volume, balance and stereo enhancement circuit 62. The volume portion of the circuit 62 is controlled by a manual volume selector 64. The enhancement portion modifies the audio signal to enhance the stereo separation effect and provides enhanced audio signals to a preamplifier 66 and a power amplifier circuit 68. The power amplifier 68 develops audio signals at appropriate levels to drive the left and right speakers 14a, 14b.

Figure 4:
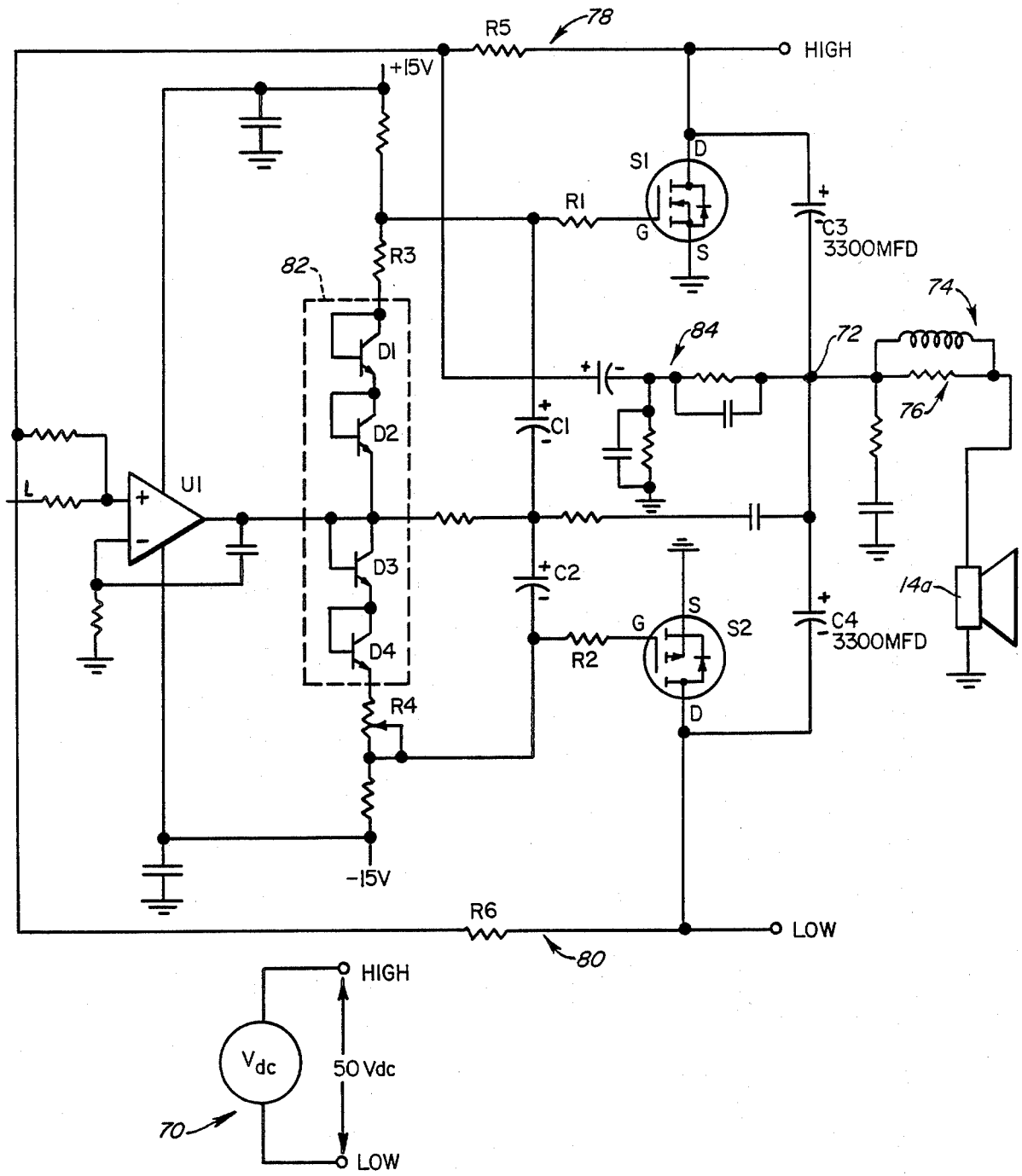
FIG. 4 is a schematic diagram of the power amplifier circuit of the present invention.

Referring now to FIG. 4, a schematic diagram of a portion of the power amplifier circuit according to the present invention is illustrated. The diagram illustrates the circuitry required for only one channel. In the preferred embodiment, two such amplifier channel circuits are utilized, one to drive the left speaker 14a and one to drive the right speaker 14b. Since both circuits are identical, only the left channel circuit will be discussed in detail herein.

The audio input signal from the preamplifier 66 is coupled to a non-inverting input of an operational amplifier U1. An inverting input of the amplifier U1 is coupled to a source of reference potential which, in the preferred embodiment, comprises ground potential. The amplifier U1 develops an amplified audio signal at its output.

A double-ended floating power supply 70 includes first and second power supply outputs designated HIGH and LOW, respectively. In the preferred embodiment, the potential difference between the LOW and HIGH outputs is 50 volts. However, since the power supply is floating, the supply is not ground referenced.

A power switch in the form of an N-type power MOSFET S1 includes drain and source electrodes between the power supply HIGH output and ground. A gate electrode of the MOSFET S1 is coupled through a resistor R1 and a coupling capacitor C1 to the output of the amplifier U1 and receives the amplified audio input signal. Similarly, a power switch in the form of a P-type power MOSFET S2 includes drain and source electrodes between the power supply LOW output and ground. A gate electrode of the MOSFET S2 is coupled through a resistor R2 and a coupling capacitor C2 to the output of the amplifier U1 to also receive the amplified audio input signal. Since the power MOSFETS S1 and S2 are of complementary conductivity type, they are alternately driven in response to the audio input signal. A DC bias circuit 82 including diodes D1-D4, resistor R3 and potentiometer R4 is coupled between the output of the amplifier U1 and the gate electrodes of the MOSFETS S1 and S2. The bias circuit 82 adds a DC bias to the amplified audio input signal to bias the MOSFETS S1 and S2 in the linear region. Accordingly, a non-zero DC voltage is present at the gate electrodes of MOSFETS S1 and S2 at all times so that their response time is decreased.

It should be noted that the power MOSFETS S1 and S2 could be replaced by any one of a number of different type switching devices as will be obvious to one skilled in the art.

First and second series-connected capacitors C3, C4, respectively, are coupled between the HIGH and LOW power supply outputs. The capacitors C3 and C4 are connected together at a junction 72. An output or load circuit 74 is coupled between the junction 72 and ground. The output circuit 74 includes the speaker 14a for the left channel and a filter 76.

A pair of DC feedback circuits 78 and 80 comprising resistors R5 and R6, respectively, sum the HIGH and LOW power supply outputs with the audio signal at non-inverting input of the amplifier U1 to reference the power supply 70 when the amplifier circuit is in a quiescent state. Thus, the power supply 70 will be centered about the reference potential in the quiescent state. Accordingly, with a 50 volt power supply 70 and a ground reference potential, the HIGH power supply output measures a positive voltage to ground, and the LOW power supply output measures as a negative voltage to ground. The positive and negative voltages will each equal one-half of the total power supply voltage, i.e. 25 volts.

An AC feedback circuit 84 couples the capacitor junction 72 with the non-inverting input of the amplifier U1. The AC feedback circuit 84 causes the audio output signal to the speaker to accurately track the audio input signal.

Figure 5:
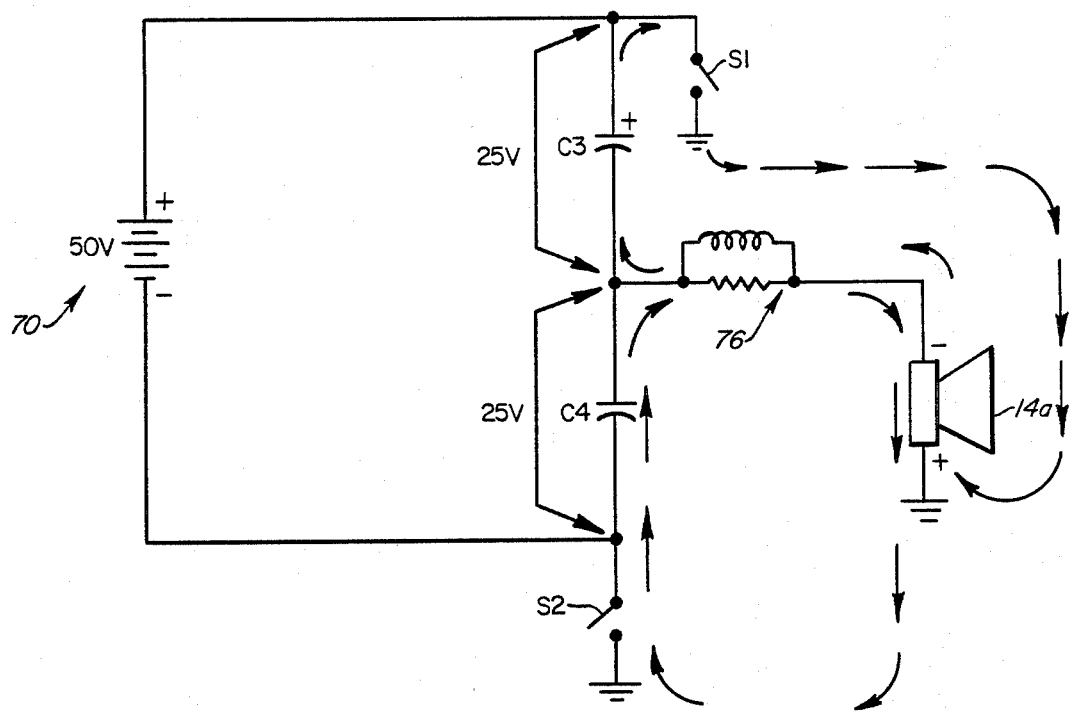
FIG. 5 is an equivalent circuit diagram of the output stage of the amplifier circuit of FIG. 4.

Referring now to FIG. 5, an equivalent circuit diagram of the output stage of the power amplifier circuit 68 is illustrated. As described above, the power MOSFETs S1 and S2 are alternately operated in response to the amplified audio input signal. Consequently, the HIGH and LOW power supply outputs are alternately coupled to ground. Accordingly, when the LOW power supply output is coupled to ground, the LOW power supply output measures 0 volts to ground, and the HIGH power supply output measures 50 volts to ground. Conversely, when the HIGH power supply output is coupled to ground, it measures 0 volts, and the LOW power supply output measures −50 volts, both referenced to ground.

Since the capacitors C3 and C4 are coupled to the HIGH and LOW power supply outputs, the alternate coupling of the power supply outputs to ground causes the capacitors C3 and C4 to alternately charge and discharge to produce an amplified version of the audio input signal in the output circuit 74 to produce a current through the speaker 14a.

Figure 6:
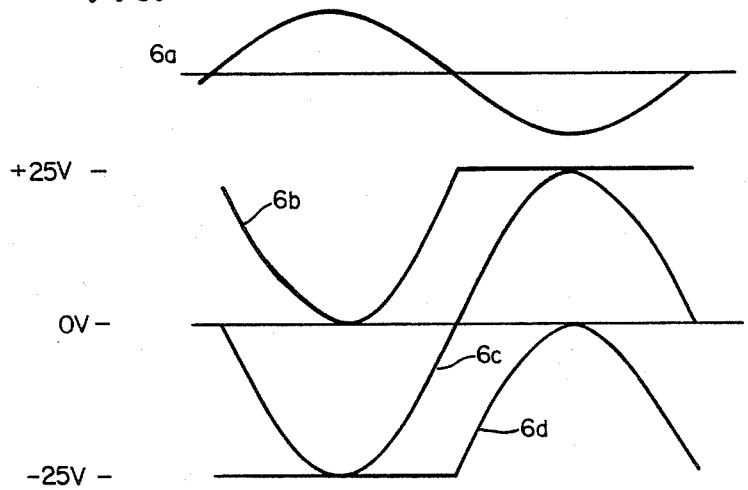
FIG. 6 is a series of waveforms produced by the circuit of the present invention in response to an audio input signal.

Referring now to FIG. 6, a series of waveforms illustrate the voltages present at different portions of the power amplifier circuit 68. The wave form 6a represents the audio signal from the preamplifier 66. A second waveform 6b represents the voltage across the N-type MOSFET S1, while wave form 6d represents the voltage across the P-type MOSFET S2. Wave form 6c represents the audio output, namely, the voltage across the speaker, which is produced by summing the wave forms 6b and 6d.

The direction of current flow through the speaker is illustrated by the arrows in FIG. 5. If the N-type MOSFET S1 is operating, i.e. when the amplified audio input signal is greater than zero, the MOSFET S1 couples the HIGH power supply output to ground and the first capacitor C3 discharges through the MOSFET S1, ground and the speaker 14a and the second capacitor C4 is charging. Conversely, if the P-type MOSFET S2 is operating, i.e. when the amplified audio input signal is less than zero, the MOSFET S2 couples the LOW power supply output to ground and the second capacitor C4 discharges through the speaker 14a, ground and the MOSFET S2 while the first capacitor C3 is charging.

It should be noted that the use of a floating power supply having outputs alternately coupled to ground, eliminates the requirement for having a pair of power supplies, or a dual voltage output power supply, resulting in fewer components being used. With fewer components, the size and cost of the amplifier are reduced, and the overall efficiency of the amplifier increases.

What is claimed is:

1. An audio power amplifier circuit comprising:
   a source of reference potential;
   a double-ended floating power supply including first and second power supply outputs;
   an input circuit for receiving an audio input signal;
   first and second switches connected between the first power supply output and the source of reference potential and between the second power supply output and the source of reference potential, respectively, each switch being coupled to the input circuit, wherein the switches are alternately operated in response to the audio input signal to alternately couple the first and second power supply outputs to the source of reference potential;
   first and second series-connected capacitors coupled between the first and second power supply outputs having a junction therebetween; and
   a load coupled between the junction and the source of reference potential wherein the alternate coupling of the power supply outputs to the source of reference potential alternately charges and discharges the capacitors to produce an audio output signal across the load whereby the audio output signal comprises an amplified version of the audio input signal.

2. The amplifier circuit of claim 1 further comprising a feedback circuit for centering the power supply output with respect to the reference potential when the amplifier circuit is in a quiescent state.

3. The amplifier circuit of claim 2 wherein the feedback circuit couples the power supply to the input circuit to sum the power supply outputs with the audio input signal. input circuit to the p supply output signals and the audio input signal.

4. The amplifier circuit of claim 1 further comprising a feedback circuit coupled between the junction and the input circuit to cause the audio output signal to track the audio input signal.

5. The amplifier circuit of claim 1 wherein the switches are complementary conductivity transistors.

6. The amplifier circuit of claim 5 wherein the first switch is an N-type power MOSFET and the second switch is a P-type power MOSFET, each said MOSFET having gate, source and drain electrodes, wherein the N-type MOSFET has its drain electrode connected to the first power supply output, its source electrode connected to the source of reference potential and its gate electrode connected to the input circuit, and the P-type power MOSFET has its drain electrode connected to second power supply output, its source electrode connected to the source of reference potential and its gate electrode connected to the input circuit.

7. The amplifier circuit of claim 1 wherein the input circuit comprises an operational amplifier including a non-inverting input coupled to the audio input signal and an inverting input coupled to the source of reference potential.

8. An audio power amplifier circuit comprising:
   an input circuit for receiving an audio input signal;
   a source of reference potential;
   a double-ended floating power supply including first and second power supply outputs;
   a feedback circuit for centering the power supply with respect to the reference potential when the amplifier circuit is in a quiescent state;
   first and second transistors connected between the first power supply output and the source of reference potential and between the second power supply output and the source of reference potential, respectively, each transistor being coupled to the input circuit, wherein the transistors are alternately driven in response to the audio input signal;
   first and second series-connected capacitors coupled between the first and second power supply outputs having a junction therebetween; and
   an output circuit coupled between the junction and the source of reference potential, wherein the transistors alternately couple the first and second power supply outputs to the source of reference potential to alternately charge and discharge the capacitors whereby an audio output signal is produced in the output circuit which is an amplified version of the audio input signal.

9. The amplifier circuit of claim 8 further comprising a feedback circuit coupled between the junction and the input circuit to cause the audio output signal to track the audio input signal.

10. The amplifier circuit according to claim 8 wherein the first and second transistors are complementary conductivity transistors.

11. The amplifier circuit of claim 10 wherein the first transister is an N-type power MOSFET and the second transistor is a P-type power MOSFET, each said MOSFET having gate, source and drain electrodes wherein the N-type MOSFET has its drain electrode connected to the first power supply output, its source electrode connected to the source of reference potential and its gate electrode connected to the input circuit, and the P-type power MOSFET has its drain electrode connected to the second power supply output, its source electrode connected to the source of reference potential and its gate electrode connected to the input circuit.

12. The amplifier circuit of claim 8 wherein the input circuit comprises an operational amplifier including a non-inverting input coupled to the audio input signal and an inverting input coupled to the source of reference potential.

13. An audio power amplifier circuit comprising:
   an input amplifier for amplifying an audio input signal;
   a source of reference potential;
   a double-ended floating DC power supply including first and second power supply outputs;
   a feedback circuit for coupling the power supply output signals with the input amplifier to sum the power supply outputs with the audio input signal to center the power supply with respect to the reference potential when the amplifier circuit is in a quiescent state;
   first and second field effect transistors (FETS) connected between the first power supply output signal and the source of reference potential and between the second power supply output signal and the source of reference potential, respectively, each FET having a gate connected to the input amplifier, wherein the FETs are alternately driven in response to the amplified audio input signal;
   first and second series-connected capacitors coupled between the first and second power supply output signals having a junction therebetween; and a speaker circuit coupled between the junction and the source of reference potential, wherein the FETs alternately couple the first and second power supply output signals to the source of reference potential to alternately charge and discharge the capacitors whereby a current representing an amplified version of the audio input signal is produced through the speaker.

14. The amplifier circuit of claim 13 further comprising a feedback circuit coupled between the junction and the input amplifier to cause the audio output signal to track the audio input signal.

15. The amplifier circuit of claim 13 wherein the first FET is an N-type power MOSFET and the second FET is a P-type power MOSFET, each said MOSFET having gate, source and drain electrodes wherein the N-type MOSFET has its drain electrode connected to the first power supply output, its source electrode connected to the source of reference potential and its gate electrode connected to the input amplifier, and the P-type power MOSFET has its drain electrode connected to second power supply output, its source electrode connected to the source of reference potential and its gate electrode connected to the input amplifier.

* * * * *